United States Patent
Fujiwara et al.

(10) Patent No.: US 11,176,997 B2
(45) Date of Patent: *Nov. 16, 2021

(54) MEMORY CELL

(71) Applicant: Taiwan Semiconductor Manufacturing Co., Ltd., Hsin-Chu (TW)

(72) Inventors: Hidehiro Fujiwara, Hsin-chu (TW); Hung-Jen Liao, Hsin-Chu (TW); Hsien-Yu Pan, Hsinchu (TW); Chih-Yu Lin, Taichung (TW); Yen-Huei Chen, Hsinchu County (TW); Chien-Chen Lin, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/186,539

(22) Filed: Feb. 26, 2021

(65) Prior Publication Data

US 2021/0201999 A1    Jul. 1, 2021

Related U.S. Application Data

(60) Continuation of application No. 16/911,049, filed on Jun. 24, 2020, now Pat. No. 10,964,389, which is a division of application No. 15/799,253, filed on Oct. 31, 2017, now Pat. No. 10,714,181.

(60) Provisional application No. 62/428,383, filed on Nov. 30, 2016.

(51) Int. Cl.
| | |
|---|---|
| *G11C 15/00* | (2006.01) |
| *G11C 15/04* | (2006.01) |
| *H01L 27/02* | (2006.01) |
| *G11C 11/412* | (2006.01) |

(52) U.S. Cl.
CPC .......... *G11C 15/04* (2013.01); *H01L 27/0211* (2013.01); *G11C 11/412* (2013.01)

(58) Field of Classification Search
CPC ........ G11C 15/04; G11C 15/00; G11C 15/046
See application file for complete search history.

(56) References Cited

U.S. PATENT DOCUMENTS

| | | | |
|---|---|---|---|
| 8,848,412 B1 | 9/2014 | Yeung | |
| 9,257,171 B2 | 2/2016 | Fujiwara et al. | |
| 9,257,172 B2 * | 2/2016 | Fujiwara | .............. G11C 8/16 |
| 2004/0114411 A1 | 6/2004 | Noda et al. | |
| 2012/0292614 A1 | 11/2012 | Matsubayashi | |

(Continued)

*Primary Examiner* — Uyen Smet
(74) *Attorney, Agent, or Firm* — Duane Morris LLP

(57) ABSTRACT

A cell structure is disclosed. The cell structure includes a first unit comprising a first group of transistors and a first data latch, a second unit comprising a second group of transistors and a second data latch a read port unit comprising a plurality of p-type transistors, a search line and a complementary search line, the search line and the complementary search line function as input of the cell structure, and a master line, the master line functions as an output of the cell structure, the first unit is coupled to the second unit, both the first and the second units are coupled to the read port unit. According to some embodiments, the first data latch comprises a first and a second p-type transistors, a first and a second n-type transistors.

20 Claims, 11 Drawing Sheets

(56) References Cited

U.S. PATENT DOCUMENTS

| | | | |
|---|---|---|---|
| 2013/0028032 A1* | 1/2013 | Koike | G11C 11/413 |
| | | | 365/189.15 |
| 2015/0248927 A1 | 9/2015 | Fujiwara | |
| 2016/0013190 A1 | 1/2016 | Liaw | |
| 2016/0156314 A1 | 6/2016 | Wang | |
| 2016/0247569 A1 | 8/2016 | Nii | |

* cited by examiner

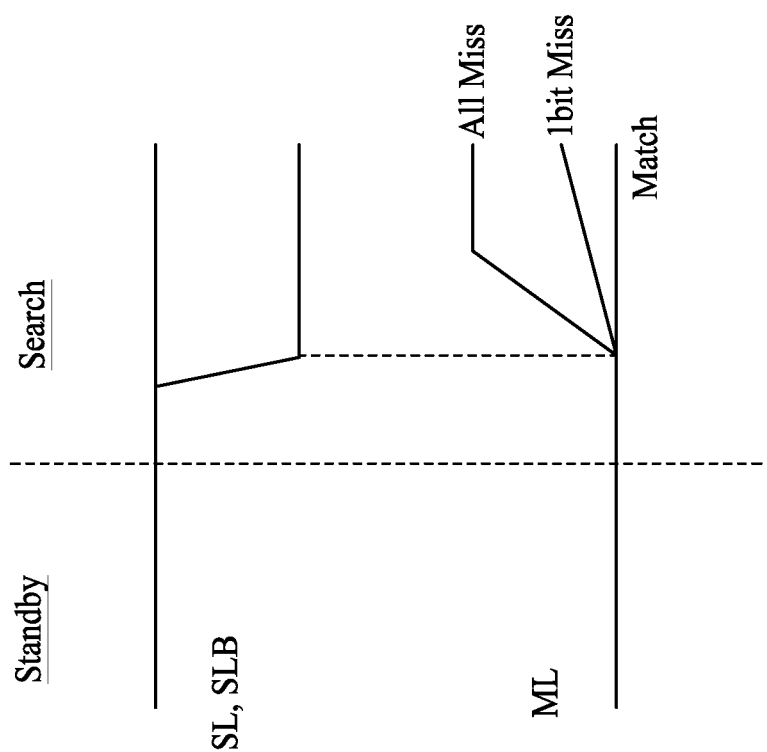

MEMORY CELL

CROSS-REFERENCE TO RELATED APPLICATIONS

The present application is a continuation of U.S. patent application Ser. No. 16/911,049, filed on Jun. 24, 2020, which is a divisional of U.S. patent application Ser. No. 15/799,253, filed on Oct. 31, 2017, which claims priority to U.S. Provisional Patent Application No. 62/428,383, filed on Nov. 30, 2016, each of which is incorporated by reference herein in its entirety.

BACKGROUND

The Integrated Circuit (IC) design industry is facing unprecedented challenges as CMOS technology approaches its fundamental physics limit. Process viability, leakage power and device reliability issues have emerged as serious concerns that nullify the performance benefits gained by traditional device scaling.

A major concern in IC designs (e.g., three-dimensional (3D) IC designs) is ensuring reliability and quality. Failure caused by aging and degradation affects the reliability and quality of IC components. Examples of known failure mechanisms include: (1) Electromigration (EM): a directional transport of electrons and metal atoms in interconnect wires leads to degradation and eventual failure; (2) Time-dependent dielectric breakdown (TDDB): wear-out of gate oxide caused by continued application of electric fields, which can lead to an electric short between the gate oxide and substrate; (3) Hot carrier injection (HCI): electrons that capture sufficient kinetic energy to overcome the barrier to gate oxide layer and cause a threshold voltage shift and performance degradation; (4) Negative bias temperature instability (NBTI): holes trapped in the gate oxide layer cause the threshold voltage to shift. The switching between negative and positive gate voltages causes performance degradation and recovery from the NBTI degradation; (5) Stress migration (SM): mechanical stress due to the differences between the expansion rates of metals causes the failure; and (6) Thermal cycling (TC): fatigue accumulates in the silicon oxide layer with temperature cycles with respect to the ambient temperature.

A ring oscillator is a device that includes an odd number of logic gates whose output oscillates between two voltage levels, representing true and false. The logic gates are typically attached in a chain and the output of the last logic gate is fed back into the first logic gate in the chain. High temperature is one cause of premature transistor aging and degradation. Ring oscillators are used as temperature sensors at the wafer level to monitor transistor aging by exploiting the linear relationship between oscillation frequency and temperature. In addition, aging and degradation resulting from various AC stress and DC stresses, such as PMOS HCI, PMOS BTI, NMOS HCI and NMOS BTI, can be tested and measured using ring oscillators.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 illustrates the operation of the TCAM cell in FIG. 1A, in accordance with some embodiments.

DETAILED DESCRIPTION

Figure 1A:
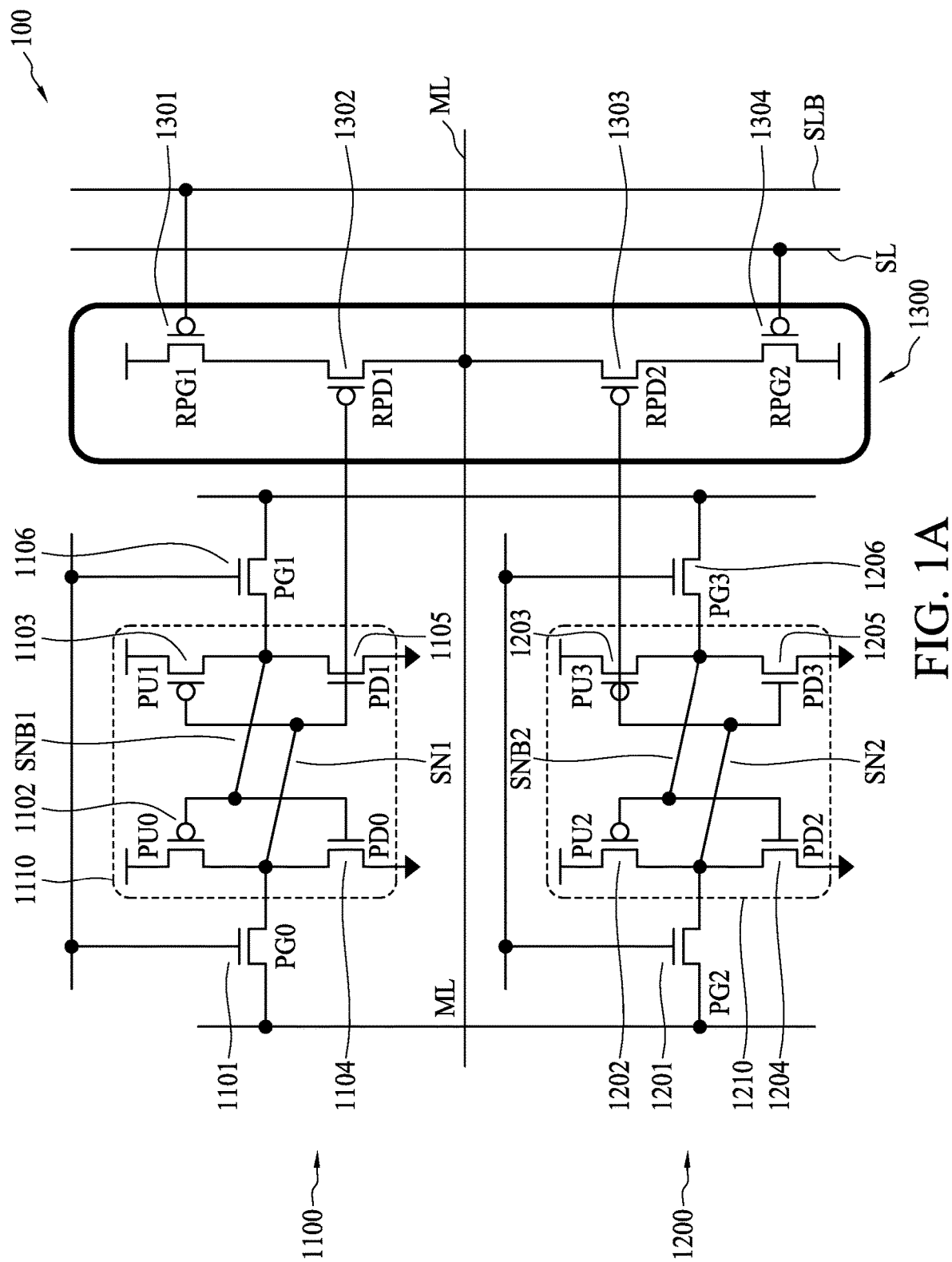
FIG. 1A is a schematic illustration of a ternary content addressable memory (TCAM) cell, in accordance with some embodiments.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Content-addressable memory (CAM) is a special type of computer memory used in certain very-high-speed searching applications. According to some embodiments, a CAM is also known as an associative memory, associative storage, or associative array. The term associative array is more often used in the context of a programming data structure. CAM compares input search data, or a tag, against a table of stored data, and returns the address of matching data. In the case of associative memory, the matching data is returned.

Because a CAM is designed to search its entire memory in a single operation, it is much faster than RAM in virtually all search applications. There are, however, cost disadvantages to CAM. Unlike a RAM chip, which has simple storage cells, each individual memory bit in a fully parallel CAM must have its own associated comparison circuit to detect a match between the stored bit and the input bit. In addition, match outputs from each cell in the data word must be combined to yield a complete data word match signal. The additional circuitry increases the physical size of the CAM chip, and as a result, increases manufacturing cost. The extra circuitry also increases power dissipation since every comparison circuit is active on every clock cycle. Accordingly, CAM is only used in specialized applications where searching speed cannot be accomplished by using a less costly method.

Binary CAM is the simplest type of CAM which uses data search words consisting entirely of 1s and 0s. Ternary CAM (TCAM) allows a third matching state of "X" or "don't care" for one or more bits in the stored dataword, and as a result, adds flexibility to the search operation. For example, a ternary CAM might have a stored word of "10XX0" which will match any of the four search words "10000", "10010", "10100", or "10110". The added search flexibility comes at an additional cost over binary CAM as the internal memory cell must now encode three possible states instead of the two of binary CAM. According to some embodiments, this additional state is typically implemented by adding a mask bit ("care" or "don't care" bit) to every memory cell. According to some embodiments, holographic associative memory provides a mathematical model for "don't care" integrated associative recollection using complex valued representation.

The operation of a MOSFET can be categorized into three different modes, depending on the voltages at the terminals. For an enhancement-mode, n-channel MOSFET, for example, the three operational modes are: (1) cutoff mode (also known as "sub-threshold" or "weak inversion" mode), when $V_{GS}<V_{th}$, where $V_{GS}$ is the gate-to-source bias voltage and $V_{th}$ is the threshold voltage for the device to turn on; (2) triode mode (also known as the "linear" or "ohmic" mode), when $V_{GS}>V_{th}$ and $V_{DS}<(V_{GS}-V_{th})$; and (3) saturation mode (also known as "active" mode), when $V_{GS}>V_{th}$ and $V_{DS}\geq (V_{GS}-V_{th})$, where $V_{DS}$ is the drain-to-source voltage. The saturation drain current $I_{dsat}$ is the drain current in saturation mode, and the linear drain current $I_{dslin}$ is the drain current in linear or ohmic mode.

Hot carrier injection (HCI) is an effect exhibited by MOSFETs, where a carrier is injected from the conducting channel in the silicon substrate to the gate dielectric (SiO2). Bias temperature instability (BTI) is another degradation phenomenon affecting MOSFETs which are stressed with negative gate voltages at elevated temperatures.

FIG. 1A is a schematic illustration of a TCAM cell 100, in accordance with some embodiments. According to some embodiments, a TCAM cell 1000 includes a first unit 1100, a second unit 1200, a third unit 1300. The first unit 1100 includes a first data latch 1110, a first pass-gate transistor (PG0) 1101 and a second pass-gate transistor (PG1) 1106. The second unit 1200 includes a second data latch 1210, a third pass-gate transistor (PG2) 1201 and a fourth pass-gate transistor (PG3) 1206.

According to some embodiments, the first data latch 1110 includes a first pull-up transistor (PU0) 1102, a second pull-up transistor (PU1) 1103, a first pull-down transistor (PD0) 1104 and a second pull-down transistor (PD1) 1105. According to some embodiments, the second data latch 1210 includes a third pull-up transistor (PU2) 1202, a fourth pull-up transistor (PU3) 1203, a third pull-down transistor (PD2) 1204 and a fourth pull-down transistor (PD3) 1205. According to some embodiments, the third unit 1300 includes a first read-port gate (RPG1) transistor 1301 and a second RPG2 transistor 1304. The third unit 1300 also includes a first read-port data (RPD1) transistor 1302 and a second RPD2 transistor 1303. According to some embodiments, the third unit 1300 is a read-port unit.

According to some embodiments, transistors 1102, 1103, 1202, 1203, 1301, 1302, 1303 and 1304 are p-type transistors, such as planar p-type field effect transistors (PFETs) or p-type fin field effect transistors (finFETs). According to some embodiments, transistors 1101, 1104, 1105, 1106, 1201, 1204, 1205 and 1206 are n-type transistors, such as planar n-type field effect transistors (NFETs) or n-type finFETs.

According to some embodiments, the gates of transistors 1101 and 1106 are coupled together, the gates of transistors 1201 and 1206 are coupled together. The sources of transistors 1101 and 1201 are coupled together. The sources of transistors 1106 and 1206 are coupled together. Transistors 1102 (PU0) and 1104 (PD0) are cross-coupled with transistors 1103 (PU1) and 1105 (PD1) to form a first data latch 1110. Similarly, transistors 1202 (PU2) and 1204 (PD2) are cross-coupled with transistors 1203 (PU3) and 1205 (PD3) to form a second data latch 1210. The gates of transistors 1103 (PU1) and 1105 (PD1) are coupled together and to the drains of transistors 1102 (PU0) and 1104 (PD0) to form a first storage node SN1, and the gates of transistors 1102 (PU0) and 1104 (PD0) are coupled together and to the drains of transistors 1103 (PU1) and 1105 (PD1) to form a complementary first storage node SNB1. The transistors in the second data latch 1210 are deployed in the same manner as in the first data latch 1110.

SN1 is coupled to the drain of the transistor 1101 and the gate of transistor 1302, and the SNB1 is coupled to the drain of transistor 1106. Similarly, SN2 is coupled to the transistor 1201 and the gate of transistor 1303, and SNB2 is coupled to the drain of transistor 1206. The gate of transistor 1301 is coupled to complementary search line SLB, and the gate of transistor 1304 is coupled to search line SL. The sources of transistors 1302 and 1303 are coupled together and to master line ML, the drains of transistors 1301 and 1302 are coupled together and the drains of transistors 1303 and 1304 are coupled together. According to some embodiments, PMOS transistors exhibits larger BTI aging effects than NMOS, as a result, the BTI effect is one of the challenges for pull up network based dynamic logic.

Figure 1B:
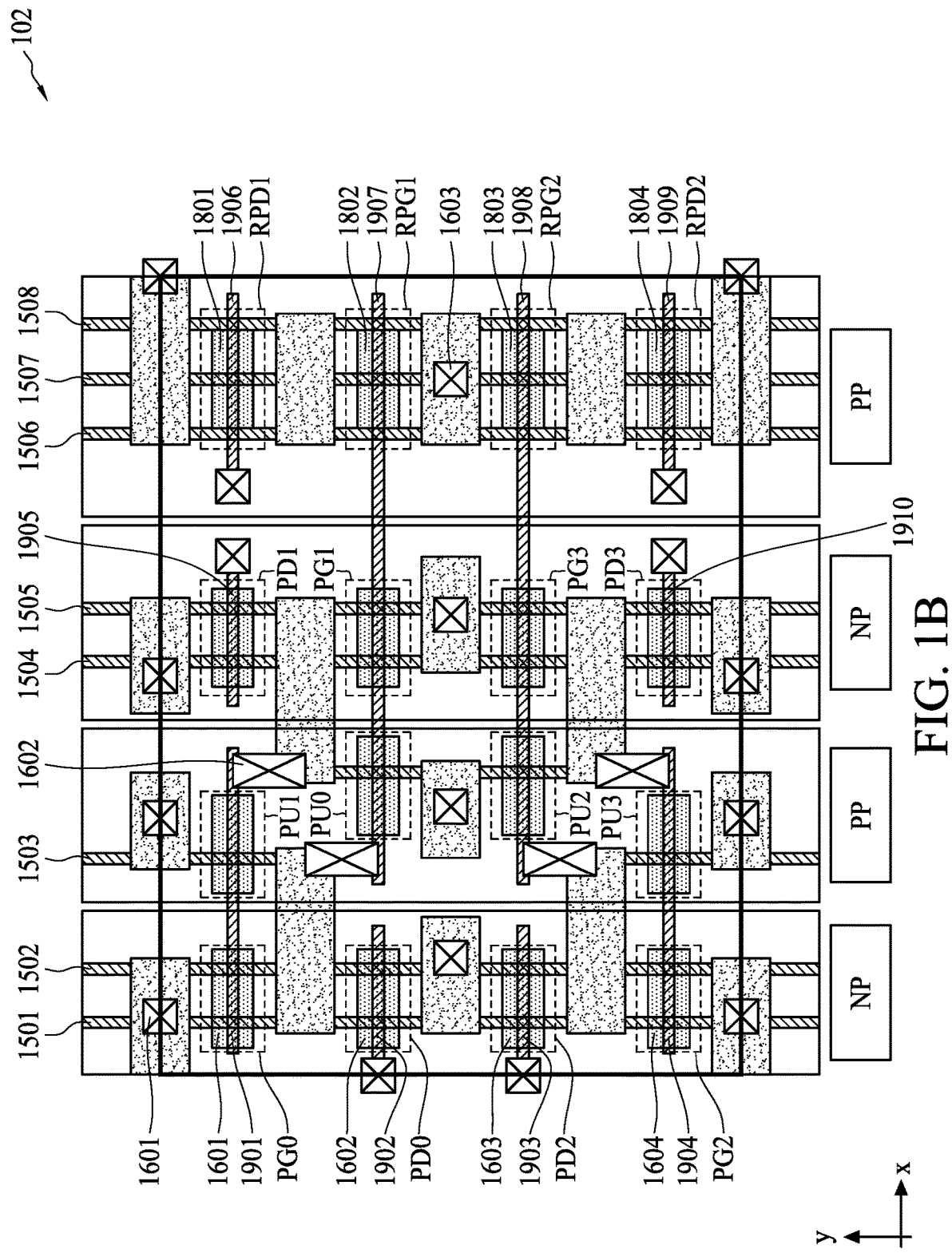
FIG. 1B is a schematic illustration of the cell layout design of the TCAM cell in FIG. 1A, in accordance with some embodiments.

FIG. 1B is a schematic illustration of the cell layout design 102 of the TCAM cell 100 of FIG. 1A, in accordance with some embodiments. According to some embodiments, FIG. 1B illustrates several distinct active areas formed in and/or on a substrate, such as a semiconductor substrate like bulk silicon, that are respective portions of the transistors PU0, PU1, PU2, PU3, PD0, PD1, PD2, PD3, PG0, PG1, PG2, PG3, RPG1, RPD1, RPD2 and RPG2, as shown in FIG. 1B. In other embodiments, there may be more or less active areas, which may be used to control a width of a transistor for current matching. The active areas, such as 1601, 1602, 1603 and 1604, in FIG. 1B extend in the X-direction, which also corresponds to a direction of current flow of the transistors during operation. Active areas depicted as crossing a boundary of the cell layout may be shared by transistors of adjacent cells. FIG. 1B further illustrates boundaries between p-doped wells PP and n-doped wells NP. N-type transistors, as discussed in FIG. 1A, may be formed in the p-doped wells PP, and p-type transistors, as discussed in FIG. 1A, may be formed in the n-doped wells NP. The active areas may be planar in the substrate to form planar FETs and/or may be fins in the substrate to form finFETs.

According to some embodiments, active areas, such as 1601, 1602, 1603 and 1604, form the source, channel, and drain regions of each of the transistors PD0, PG0, PG2, and PD2. One active area forms the source, channel, and drain regions of the transistor PU0, and another active area forms the source, channel, and drain regions of the transistor PU2. The active areas for the transistors PU0 and PU2 may be substantially aligned along longitudinal axes. One active area forms the source, channel, and drain regions of each of the transistors PU1 and PU3. One active area forms the source, channel, and drain regions of each of the transistors PG1, PD1, PD3, and PG3. Active areas, such as 1801, 1802, 1803 and 1804, form the source, channel, and drain regions of each of the transistors RPG1, RPD1, RPD2 and RPG2. The formation process of the transistors RPG1, RPD1, RPD2 and RPG2 may differ from the formation process of the transistors PD0, PD1, PD2, PD3, PG0, PG1, PG2, and PG3, such that, for example, a threshold voltage of transistor PD1 is a higher than a threshold voltage of transistor RPD1, such as the difference being larger than 30 mV.

According to some embodiments, FIG. 1B further illustrates ten distinct gate structures 1901, 1902, 1903, 1904, 1905, 19076, 1907, 1908, 1909 and 1910, which may include a gate dielectric with a conductive material, such as doped polysilicon, a metal, and/or silicide, thereover. As depicted in FIG. 1B, the gate structures extend in the Y-direction. Transistors PD0 and PU0 share a common gate structure over respective channel regions of the transistors PD0. According to some embodiments, the search ports RPG1, RPG2, RPD1 and RPD2 are PMOS transistors which are different from PG and PD transistors. According to some embodiments, when PMOS transistors are stronger than NMOS transistors, an increased performance of search operation is achieved. According to some embodiments, transistor PG0 has a gate structure over its channel region, and the gate structure may be shared by another transistor in an adjacent cell. Transistor PG2 has a gate structure over its channel region, and the gate structure may be shared by another transistor in an adjacent cell. Transistors PD2 and PU2 share a common gate structure over respective channel regions of the transistors PD2 and PU2. Transistors PU1, PD1, and RPD1 share a common gate structure over respective channel regions of the transistors PU1, PD1, and RPD1. Transistors PU3, PD3, and RPD2 share a common gate structure over respective channel regions of the transistors PU3, PD3, and RPD2. Transistor PG1 has a gate structure over its channel region, and transistor PG3 has a gate structure over its channel region. Transistor RPG1 has a gate structure over its channel region, and transistor RPG2 has a gate structure over its channel region.

As discussed above with respect to FIG. 1A, according to some embodiments, a first storage node contact SN1 couples together the drain of transistor PD0, a source/drain region of transistor PG0, the drain of transistor PU0, and the common gate structure for transistors PU1, PD1, and RPD1. The first storage node contact SN1 may comprise a butted contact between the active area of transistor PU0 and the common gate structure for transistors PU1, PD1, and RPD1. A first complementary storage node contact SNB1 couples together the drain of transistor PD1, a source/drain region of transistor PG1, the drain of transistor PU1, and the common gate structure for transistors PU0 and PD0. The first complementary storage node contact SNB1 may comprise a butted contact between the active area of transistor PU1 and the common gate structure for transistors PU0 and PD0. A second storage node contact SN2 couples together the drain of transistor PD2, a source/drain region of transistor PG2, the drain of transistor PU2, and the common gate structure for transistors PU3, PD3, and RPD2. The second storage node contact SN2 may comprise a butted contact between the active area of transistor PU2 and the common gate structure for transistors PU3, PD3, and RPD2. A second complementary storage node contact SNB2 couples together the drain of transistor PD3, a source/drain region of transistor PG3, the drain of transistor PU3, and the common gate structure for transistors PU2 and PD2. The second complementary storage node contact SNB2 may comprise a butted contact between the active area of transistor PU3 and the common gate structure for transistors PU2 and PD2. Respective contacts (unnumbered) couple active areas of transistors RPD1 and RPG1 together and of transistors RPD2 and RPG2 together.

FIG. 2 is an illustration of the operation of the TCAM cell 100 of FIG. 1A, in accordance with some embodiments. According to some embodiments, the search line SL and complementary search line SLB (search line bar) both serve as input to the cell structure, and the master line ML serves as the output of the cell structure. According to some embodiments, when one of RPG2 and RPG1 is opened, one of SL and SLB becomes low and the other one stays high. If the gate of RPG2 becomes low and the gate of RPD2 is high, then ML is not charged. If the gate of RPG2 becomes low and the gate of RPD2 is low, then ML is discharged. If ML is kept at low in search operation, it means a "match". On the other hand, if ML is charged to high, it means a "mismatch". Initially, the cell is at standby state. In order to mitigate NBTI effect, the initial value of ML is set to low (L) and initial value of SL is set to high (H). Take transistor RPD1 as an example, under such condition, even if the gate of RPD1 is L, only Vth is biased from the source side so that the NBTI effect is small enough not to become a concern. As a comparison, if ML is initially set to high at standby, then VDD is biased from both source and the drain side. Once an input is given on the search line SL and SLB at time t, an output is present on the output ML. FIG. 2 illustrates the waveforms on the ML from 0 miss (match), 1-bit miss, . . . to all-miss. The waveforms all saturate at a constant voltage level, the number of misses determines how fast it saturates. According to some embodiments, when the search line value is not found, then there is a "miss", otherwise, if the search line value is found, then there is a "match".

Figure 3:
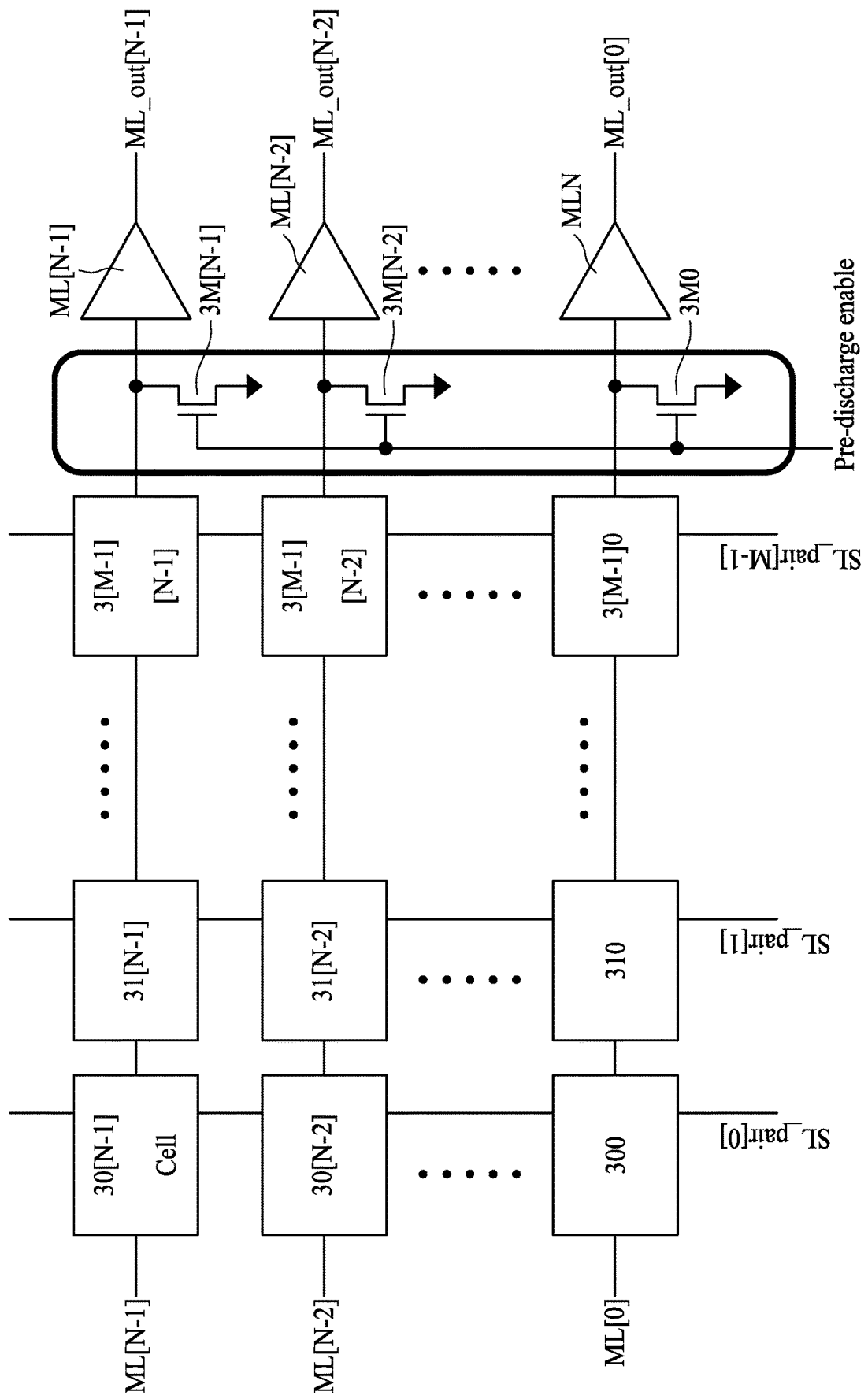
FIG. 3 is a schematic illustration of the operation of a TCAM cell, in accordance with some embodiments.

FIG. 3 is a schematic illustration of the operation of a matrix of TCAM cells, in accordance with some embodiments. According to some embodiments, a plurality of TCAM cells illustrated in FIG. 1A can be arranged as a N-by-M matrix, as illustrated in FIG. 3. There are N master lines, ML[0] through ML[N−1], and there are M search line pairs SL_pair[0] through SL_pair[M−1]. At each grid point [I, J], there is positioned a TCAM cell[I, J]. There is additionally N pre-discharge enable transistors 3M0, 3M1, . . . through 3M[N−1], where the gates of all N pre-discharge enable transistors are coupled together. For each pre-discharge enable transistor K, there is a corresponding amplifier ML[K], and a corresponding output ML_out[K]. Similar to the discussion regarding mitigating NBTI effect in FIG. 2, when the TCAM cells are arranged as a N-by-M matrix, ML[0] through ML[N−1] are all set to "L", so that even if RPD0 is "L", NBTI effect is mitigated.

Figure 4A:
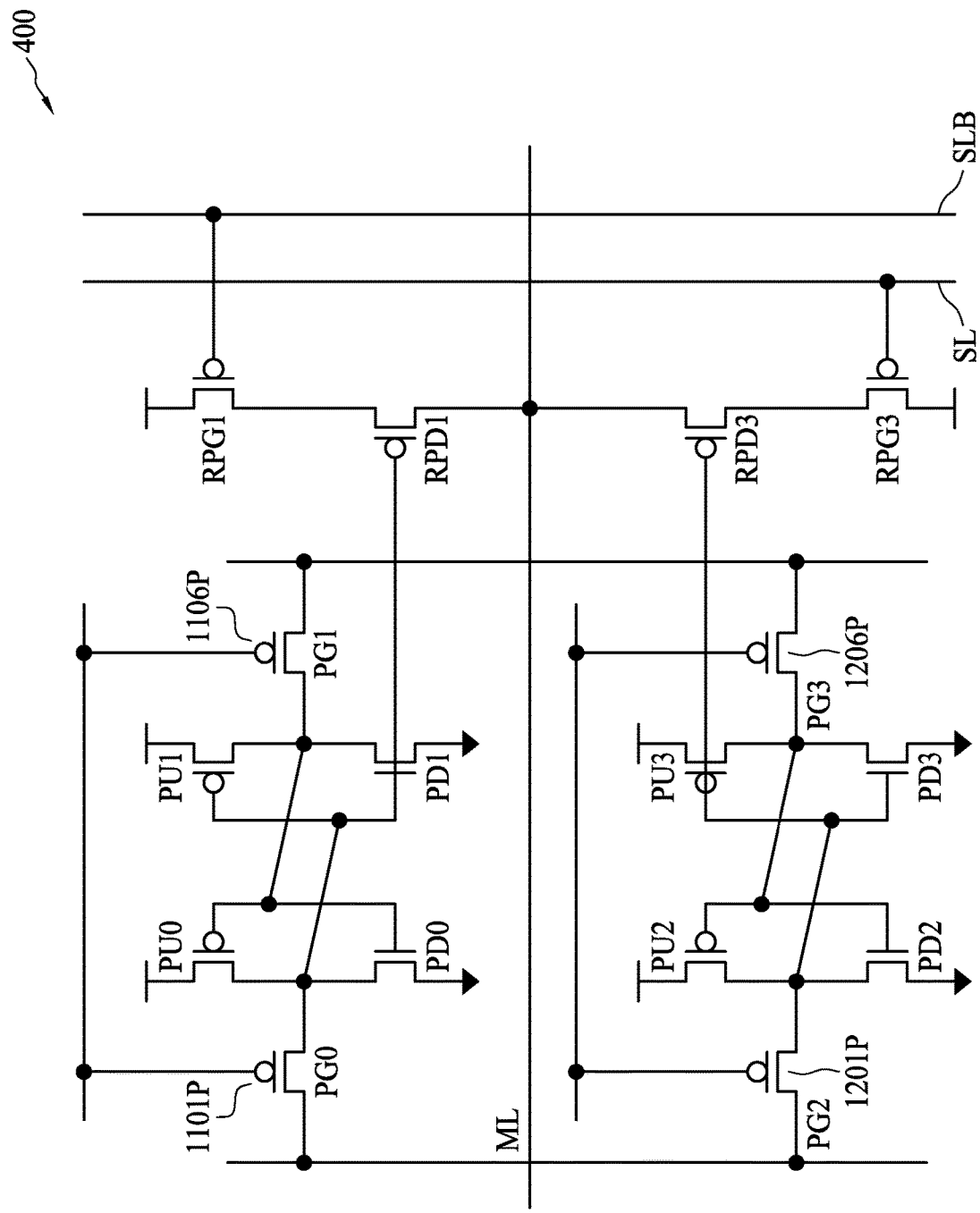
FIG. 4A is a schematic illustration of another TCAM cell, in accordance with some embodiments.

FIG. 4A is a schematic illustration of another TCAM cell 400, in accordance with some embodiments. According to some embodiments, the cell structure in FIG. 4A is similar to the structure in FIG. 1A, and the difference is that the pass-gate transistors PG0 and PG1 in FIG. 1A are n-type transistors 1101 and 1106, while in FIG. 4A, the pass-gate transistors PG0 and PG1 are p-type transistors 1101P and 1106P. Similarly, the n-type pass-gate transistors 1201 (PG2) and 1206 (PG3) in FIG. 1A are replaced with p-type transistors 1201P and 1206P in FIG. 4A. One aspect of this design change is that it allows the merging of NP and PP wells, as discussed below with respect to FIG. 4B. For purposes of brevity, a description of the structures of FIG. 4A that are the same as the structures of FIG. 1B are not repeated here.

Figure 4B:
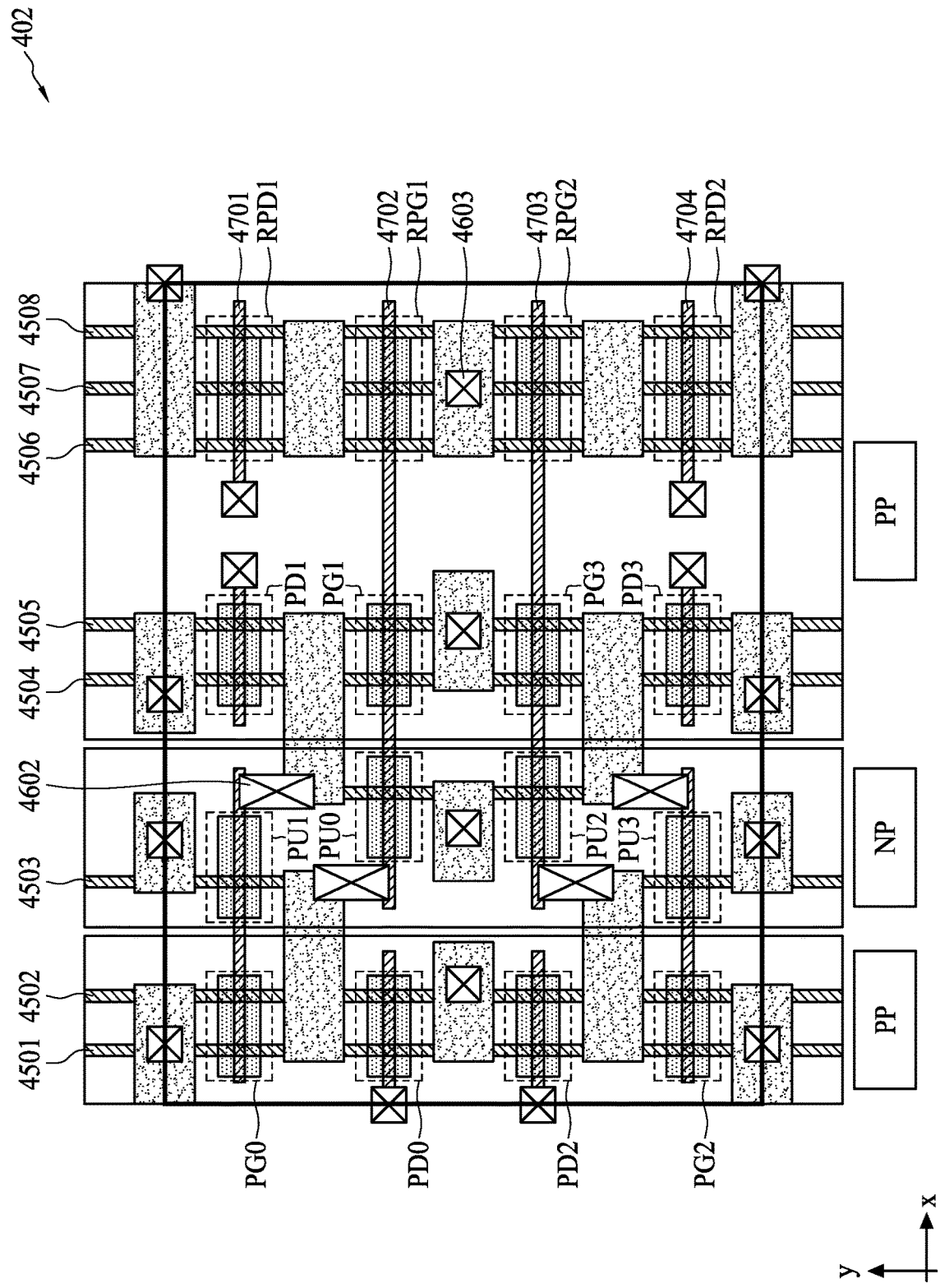
FIG. 4B is a schematic illustration of the cell layout design of the TCAM cell in FIG. 4A, in accordance with some embodiments.

FIG. 4B is a schematic illustration of the cell layout design 402 of the TCAM cell of FIG. 4A, in accordance with some embodiments. A person of ordinary skill in the art will readily understand how to modify the cell layout in FIG. 1B to correspond to the cell layout in FIG. 4B. Due to the fact that n-type transistors 1101, 1106, 1201 and 1206 are replaced with p-type transistors 1101P, 1106P, 1201P and 1206P, the right NP well and the right PP well in FIG. 1B are merged into one PP well in FIG. 4B. As a result, the cell size is reduced, the overall signal efficiency is increased and the manufacturing cost is lowered.

Figure 5A:
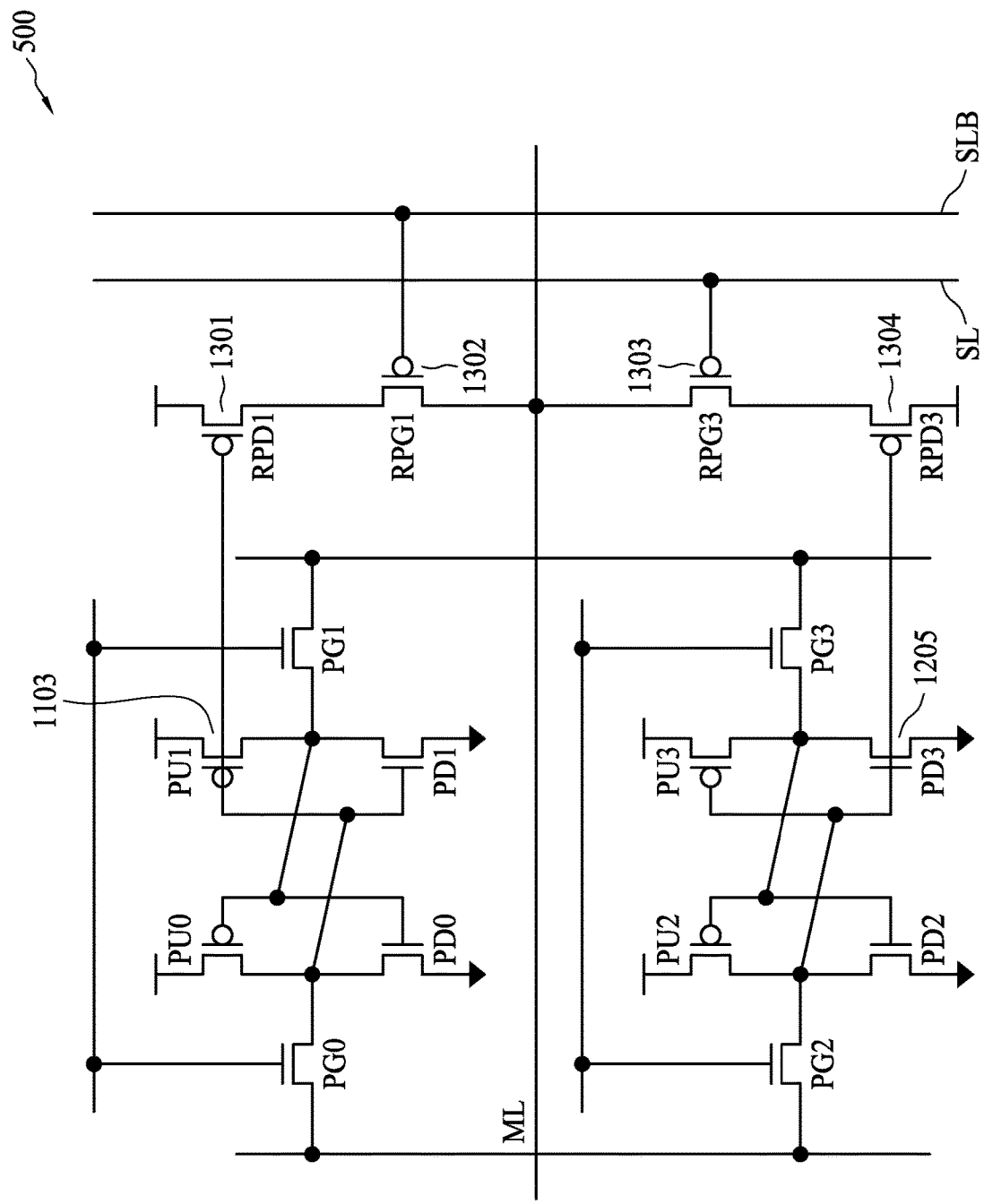
FIG. 5A is a schematic illustration of yet another TCAM cell, in accordance with some embodiments.

FIG. 5A is a schematic illustration of yet another TCAM cell 500, in accordance with some embodiments. According to some embodiments, the cell structure in FIG. 5A is similar to the structure in FIG. 1A, and the difference is that in FIG. 5A, SN1 is coupled to the gate of transistor 1301, not 1302 as in FIG. 1A. Similarly, SN2 is coupled to transistor 1304, not 1303 as in FIG. 1A. This change provides a cell layout design change as discussed in further detail below with respect to FIG. 5B.

Figure 5B:
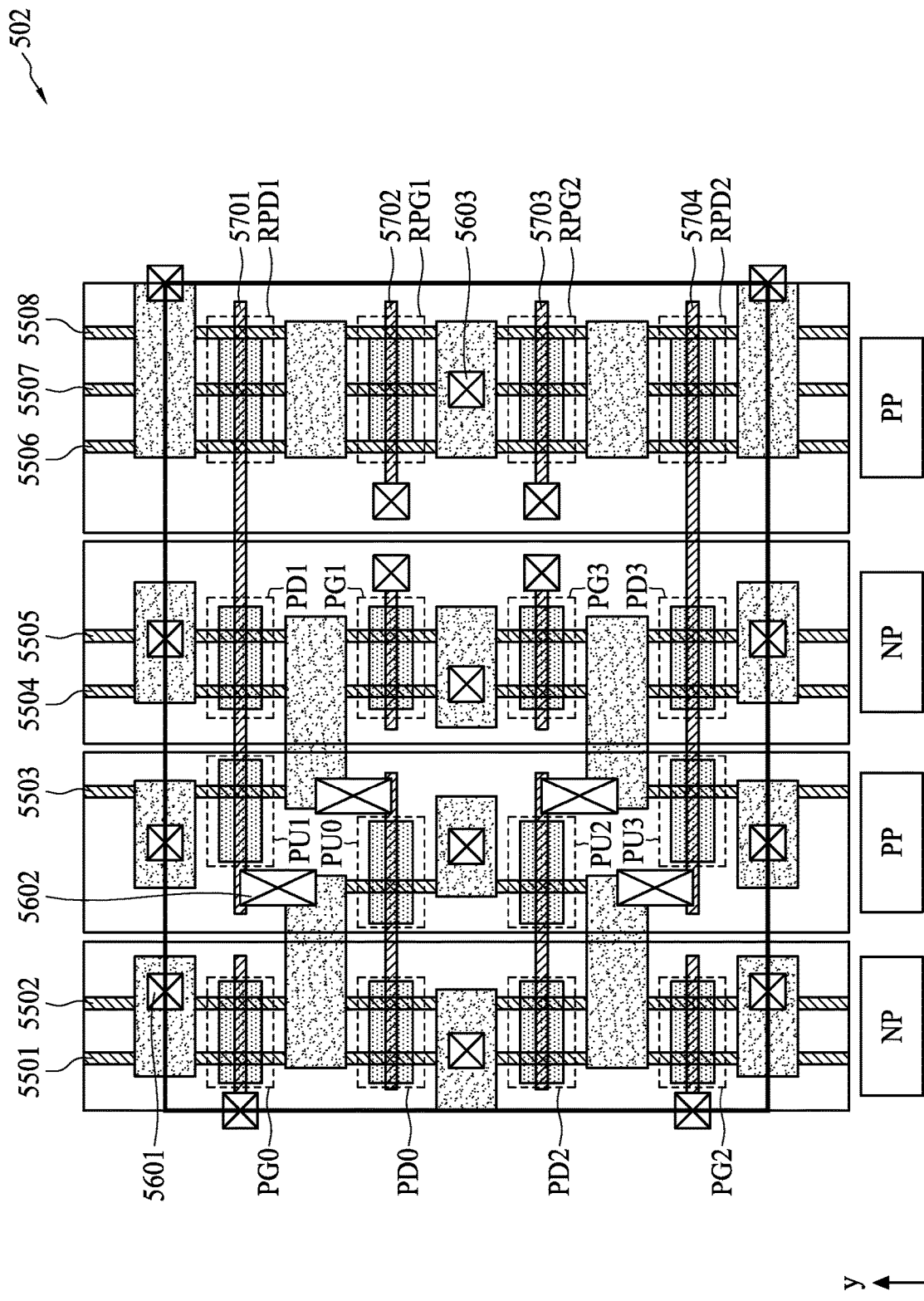
FIG. 5B is a schematic illustration of the cell layout design of the TCAM cell in FIG. 5A, in accordance with some embodiments.

FIG. 5B is a schematic illustration of the cell layout design 502 of the TCAM cell 500 of FIG. 5A, in accordance with some embodiments. A person of ordinary skill in the art will readily understand how to modify the cell layout in FIG. 1B to correspond to the cell layout in FIG. 5B. In summary, 5701 connects the gates of RPD1 and PU1, and 5704 connects the gates of RPD2 and PD3. As a comparison in FIG. 1B, 1802 connects the gates of RPD1 and PD1, and 1803 connects the gates of RPD2 and PU3.

Figure 6A:
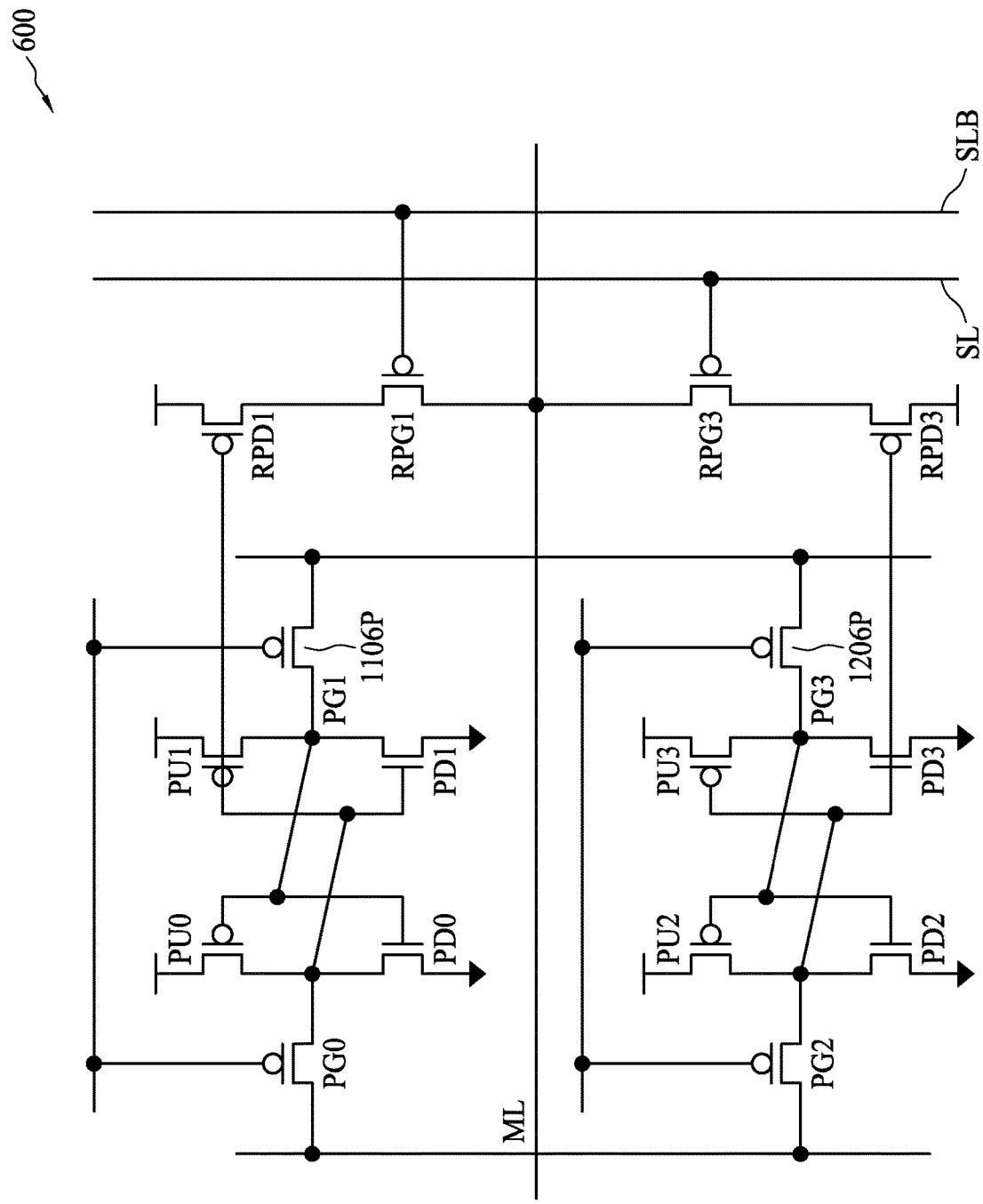
FIG. 6A is a schematic illustration of still another TCAM cell, in accordance with some embodiments.

FIG. 6A is a schematic illustration of still another TCAM cell 600, in accordance with some embodiments. According to some embodiments, the cell structure in FIG. 6A is similar to the structure in FIG. 4A, and the difference is that in FIG. 6A, SN1 is coupled to the gate of transistor 1301, not 1302 as in FIG. 4A. Similarly, SN2 is coupled to transistor 1304, not 1303 as in FIG. 4A. This change allows a change in cell design layout as discussed below with reference to FIG. 6B.

Figure 6B:
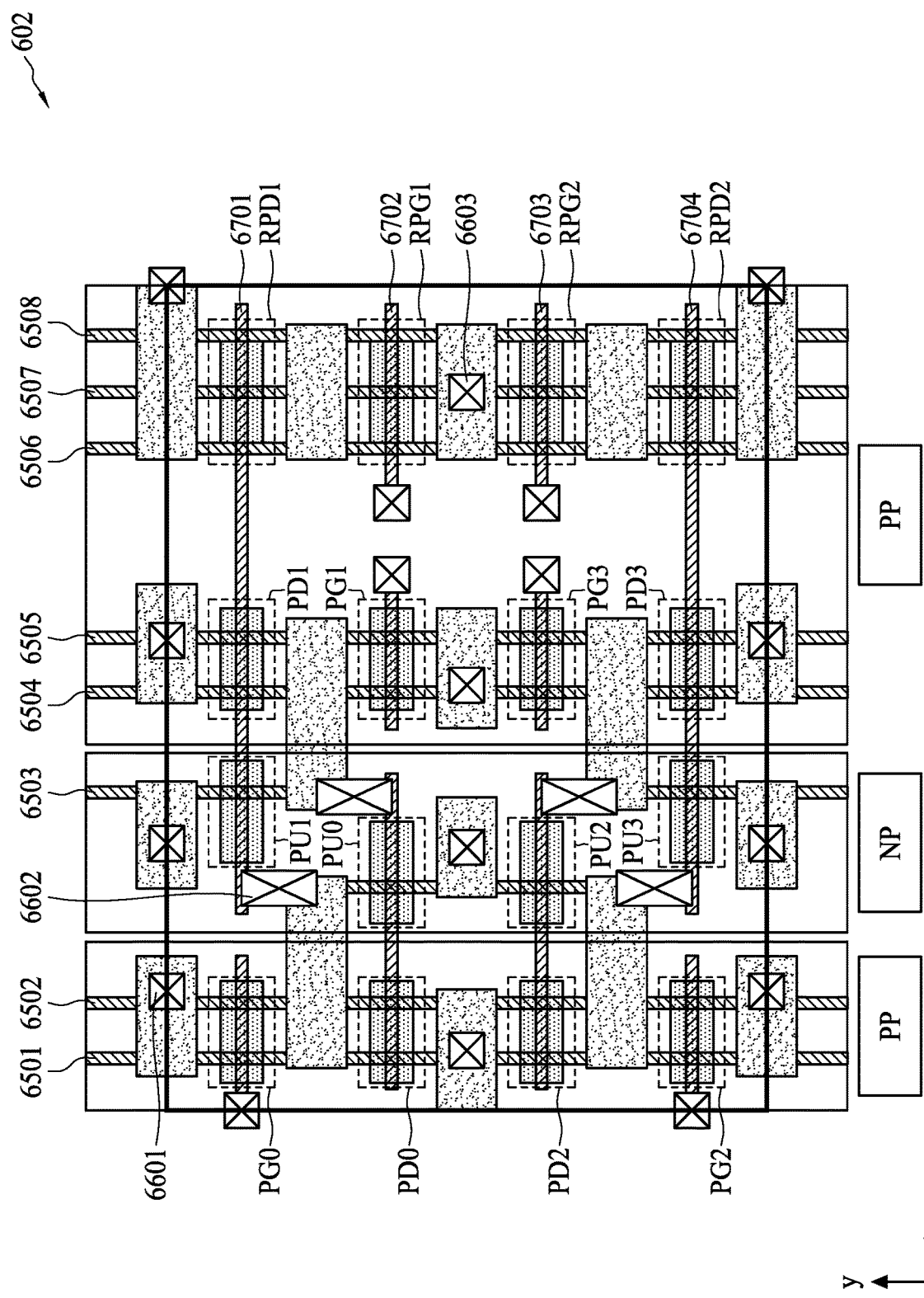
FIG. 6B is a schematic illustration of the cell layout design of the TCAM cell in FIG. 6A, in accordance with some embodiments.

FIG. 6B is a schematic illustration of the cell layout design of the TCAM cell in FIG. 6A, in accordance with some embodiments. A person of ordinary skill in the art will readily understand how to modify the cell layout in FIG. 4B to correspond to the cell layout in FIG. 6B. In summary, 6701 connects the gates of RPD1 and PU1, 6704 connects the gates of RPD2 and PD3. As a comparison in FIG. 4B, 4702 connects the gates of RPD1 and PD1, 4703 connects the gates of RPD2 and PU3.

Figure 7:
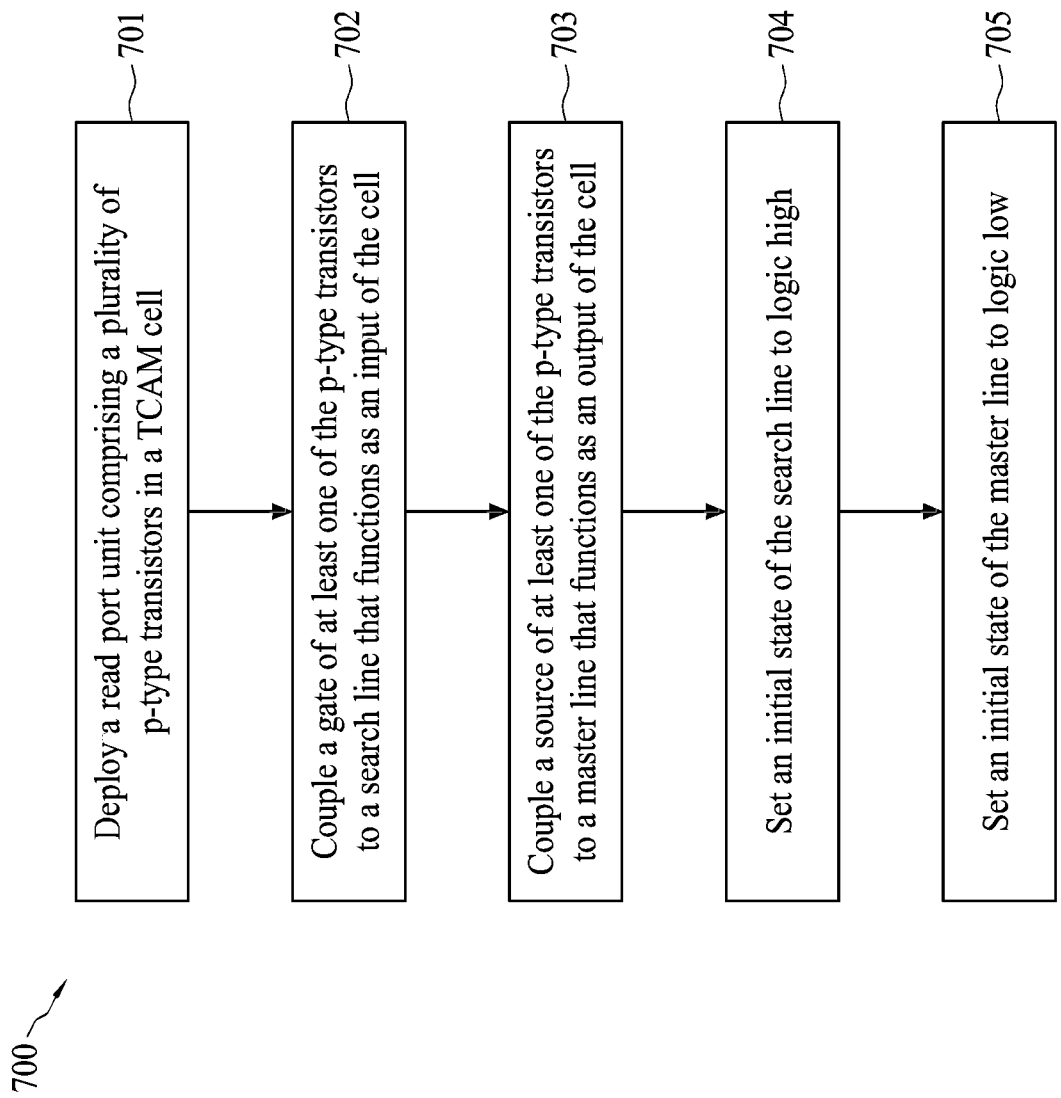
FIG. 7 is a flow chart illustrating a method for reducing negative bias temperature instability in a TCAM cell, in accordance with some embodiments.

FIG. 7 is a flow chart illustrating a method for reducing negative bias temperature instability in a TCAM cell, in accordance with some embodiments. As shown in FIG. 7, a read port unit comprising a plurality of p-type transistors is deployed at operation 701 in a TCAM cell. At operation 702, a gate of at least one of the p-type transistors is coupled to a search line that functions as an input of the cell. At operation 703, a source of at least one of the p-type transistors is coupled to a master line that functions as an output of the cell. An initial state of the search line is set at operation 704 to logic high. An initial state of the master line is set at operation 705 to logic low.

According to some embodiments, a cell structure is disclosed. The cell structure includes a first unit comprising a first group of transistors and a first data latch, a second unit comprising a second group of transistors and a second data latch, a read port unit comprising a plurality of p-type transistors, a search line and a complementary search line, the search line and the complementary search line function as input of the cell structure, and a master line, the master line functions as an output of the cell structure, the first unit is coupled to the second unit, both the first and the second units are coupled to the read port unit. According to some embodiments, the first data latch comprises a first and a second p-type transistors, a first and a second n-type transistors. According to some embodiments, the second data latch comprises a third and a fourth p-type transistors, a third and a fourth n-type transistors. According to some embodiments, the gates of the first p-type transistor and the first n-type transistor are coupled together, the gates of the second p-type transistor and the second n-type transistor are coupled together, the drain of the first p-type transistor and the source of first n-type transistor are coupled together, and further coupled to the gates of the second p-type transistor and the second n-type transistor to form a first storage node, the drain of the second p-type transistor and the source of second n-type transistor are coupled together, and further coupled to the gates of the first p-type transistor and the first n-type transistor to form a first complementary storage node.

According to some embodiments, the gates of the third p-type transistor and the third n-type transistor are coupled together, the gates of the fourth p-type transistor and the fourth n-type transistor are coupled together, the drain of the third p-type transistor and the source of third n-type transistor are coupled together, and further coupled to the gates of the fourth p-type transistor and the fourth n-type transistor to form a second storage node, the drain of the fourth p-type transistor and the source of fourth n-type transistor are coupled together, and further coupled to the gates of the third p-type transistor and the third n-type transistor to form a second complementary storage node. According to some embodiments, the read port comprises four p-type read port transistors. According to some embodiments, the gate of the second p-type read port transistor is coupled to the first storage node, the gate of the third p-type read port transistor is coupled to the second storage node, the gate of the first p-type read port transistor is coupled to the complementary search line, and the gate of the fourth p-type read port transistor is coupled to the search line.

According to some embodiments, the first group of transistors comprises two n-type transistors, and the second group of transistors comprises two n-type transistors. According to some embodiments, the gates of the n-type transistors of the first group are coupled together, the gates of the n-type transistors of the second group are coupled together. According to some embodiments, the sources of the first n-type transistor of the first group and first n-type transistor of the second group are coupled together, sources of the second n-type transistor of the first group and second n-type transistor of the second group are coupled together. According to some embodiments, the drain of the first n-type transistor of the first group is coupled to the first storage node, wherein the drain of the second n-type transistor of the first group is coupled to the first complementary storage node. According to some embodiments, the drain of the first n-type transistor of the second group is coupled to the second storage node, the drain of second n-type transistor of the second group is coupled to the second complementary storage node. According to some embodiments, the first group of transistors comprises two p-type transistors, and the second group of transistors comprises two p-type transistors. According to some embodiments, the gate of the first p-type read port transistor is coupled to the first storage node, the gate of the fourth p-type read port transistor is coupled to the second storage node, the gate of the first p-type read port transistor is coupled to the complementary search line, and the gate of the fourth p-type read port transistor is coupled to the search line.

According to some embodiments, another device is disclosed. The device includes a plurality of TCAM cells arranged in a number of rows and a number of columns, each TCAM cell includes a master line and a search line, the number of rows is at least two, and the number of columns is at least two, the search lines of the TCAM cells in each column are electrically coupled together, the master lines of the TCAM cells in each row are electrically coupled together, and a number of transistors for pre-discharge enable, the number of transistors is equal to the number of rows, the gates of the number of transistors are electrically coupled together, the source of the transistors are electrically coupled to the master lines of corresponding rows of TCAM cells.

According to some embodiments, the number of rows is three. According to some embodiments, the number of column is three. According to some embodiments, the number of rows is four. According to some embodiments, the number of column is four.

According to some embodiments, a method for reducing NBTI in a TCAM cell is disclosed. The method includes: deploying a read port unit comprising a plurality of p-type transistors in the cell; coupling a gate of at least one of the p-type transistors to a search line, wherein the search line functions as an input of the cell; coupling a source of at least one of the p-type transistors to a master line, wherein the master line functions as an output of the cell; setting an initial state of the search line to logic high; and setting an initial state of the master line to logic low.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A cell structure, comprising:
a first unit comprising a first group of transistors and a first data latch;
a second unit comprising a second group of transistors and a second data latch;
a read port unit comprising a plurality of p-type transistors;
a search line and a complementary search line, wherein the search line and the complementary search line function as inputs to the cell structure; and
a master line, wherein the master line functions as an output of the cell structure,
wherein an initial state of the search line is set and kept to logic high before the cell structure enters each search operation mode,
wherein an initial state of the master line is set and kept to logic low before the cell structure enters each search operation mode.

2. The cell structure of claim 1, wherein:
the read port unit comprises a first p-type read port transistor and a second p-type read port transistor;
the first data latch comprises first and second p-type transistors, and first and second n-type transistors; and
both the first and the second units are operatively coupled to the read port unit.

3. The cell structure of claim 2, wherein the second data latch comprises a third and a fourth p-type transistors, a third and a fourth n-type transistors.

4. The cell structure of claim 3, wherein
gates of the first p-type transistor and the first n-type transistor are coupled together, gates of the second p-type transistor and the second n-type transistor are coupled together;
drain of the first p-type transistor and source of the first n-type transistor are coupled together, and further coupled to the gates of the second p-type transistor and the second n-type transistor to form a first storage node; and
drain of the second p-type transistor and source of the second n-type transistor are coupled together, and further coupled to the gates of the first p-type transistor and the first n-type transistor to form a first complementary storage node.

5. The cell structure of claim 4, wherein
gates of the third p-type transistor and the third n-type transistor are coupled together, gates of the fourth p-type transistor and the fourth n-type transistor are coupled together;
drain of the third p-type transistor and source of the third n-type transistor are coupled together, and further coupled to the gates of the fourth p-type transistor and the fourth n-type transistor to form a second storage node; and
drain of the fourth p-type transistor and source of the fourth n-type transistor are coupled together, and further coupled to the gates of the third p-type transistor and the third n-type transistor to form a second complementary storage node.

6. The cell structure of claim 5, wherein
the read port unit further comprises a third p-type read port transistor and a fourth p-type read port transistor;
gate of the fourth p-type read port transistor is coupled to the search line;
source of the fourth p-type read port transistor is coupled to the power supply line;
gate of the third p-type read port transistor is coupled to the second data latch; and
source of the third p-type read port transistor is coupled to the master line.

7. The cell structure of claim 6, wherein
gate of the second p-type read port transistor is coupled to the first storage node;
gate of the third p-type read port transistor is coupled to the second storage node;

drains of the first p-type read port transistor and the second p-type read port transistor are coupled together; and drains of the third p-type read port transistor and the fourth p-type read port transistor are coupled together.

8. The cell structure of claim 7, wherein the first group of transistors comprises two p-type transistors, and the second group of transistors comprises two p-type transistors.

9. The cell structure of claim 8, wherein:
gate of the first p-type read port transistor is coupled to the first storage node;
gate of the fourth p-type read port transistor is coupled to the second storage node;
gate of the first p-type read port transistor is coupled to the complementary search line; and
gate of the fourth p-type read port transistor is coupled to the search line.

10. The cell structure of claim 1, wherein the first unit is operatively coupled to the second unit.

11. The cell structure of claim 2, wherein:
gate of the first p-type read port transistor is coupled to the complementary search line; and
source of the first p-type read port transistor is coupled to a power supply line.

12. The cell structure of claim 2, wherein:
gate of the second p-type read port transistor is coupled to the first data latch; and
source of the second p-type read port transistor is coupled to the master line.

13. A device, comprising:
a cell array including a plurality of ternary content-addressable memory (TCAM) cells arranged in N number of rows and M number of columns,
wherein each TCAM cell includes a master line and a search line,
wherein N is at least two, and M is at least two,
wherein an initial state of each of search lines in the cell array is kept to logic high before the TCAM cells enter a search operation mode,
wherein an initial state of each of master lines in the cell array is kept to logic low before the TCAM cells enter the search operation mode; and
a plurality of transistors for pre-discharge enable.

14. The device of claim 13, wherein a quantity of the plurality of transistors is equal to N.

15. The device of claim 13, wherein:
the search lines of the TCAM cells in each column are electrically coupled together;
the master lines of the TCAM cells in each row are electrically coupled together;
gates of the plurality of transistors are electrically coupled together;
sources of the plurality of transistors are electrically coupled to the master lines of corresponding rows of the TCAM cells; and
drains of the plurality of transistors are electrically coupled to a ground line.

16. The device of claim 13, wherein source of each of the plurality of transistors is electrically connected to an amplifier.

17. The device of claim 13, wherein M is equal to N.

18. A method, the method comprising:
deploying a plurality of p-type transistors in a cell;
coupling a gate of at least one of the p-type transistors to a search line;
coupling a source of at least one of the p-type transistors to a master line;
setting and keeping an initial state of the search line to logic high before the cell enters a search operation mode; and
setting and keeping an initial state of the master line to logic low before the cell enters the search operation mode.

19. The method of claim 18, further comprising:
coupling, to a read port unit comprising the plurality of p-type transistors, a first unit comprising a first group of transistors and a first data latch; and
coupling, to the first unit and to the read port unit, a second unit comprising a second group of transistors and a second data latch.

20. The method of claim 18, further comprising: coupling a gate of at least one of the p-type transistors to a complementary search line, wherein the complementary search line functions as an input of the cell.

* * * * *